United States Patent
Clauter et al.

(10) Patent No.: US 11,009,540 B2
(45) Date of Patent: May 18, 2021

(54) APPARATUS AND METHOD FOR ENERGY RECOVERY

(71) Applicant: Integrated Technology Corporation, Tempe, AZ (US)

(72) Inventors: Steven T. Clauter, Goodyear, AZ (US); Gary B. Rogers, Mesa, AZ (US); Norvell Eric Austin, Gilbert, AZ (US); Bradley T. Wolford, Scottsdale, AZ (US)

( * ) Notice: Subject to any disclaimer, the term of this patent is extended or adjusted under 35 U.S.C. 154(b) by 540 days.

(21) Appl. No.: 15/455,810

(22) Filed: Mar. 10, 2017

(65) Prior Publication Data
US 2018/0259568 A1    Sep. 13, 2018

(51) Int. Cl.
G01R 31/26    (2020.01)
G01R 1/36     (2006.01)

(52) U.S. Cl.
CPC .............. G01R 31/26 (2013.01); *G01R 1/36* (2013.01)

(58) Field of Classification Search
CPC ............ G01R 31/26; H02J 7/025; H02J 50/10
See application file for complete search history.

(56) References Cited

U.S. PATENT DOCUMENTS

| | | | |
|---|---|---|---|
| 2011/0062935 A1* | 3/2011 | Gray | H02M 1/34 323/311 |
| 2012/0217950 A1* | 8/2012 | Peting | H05B 33/0824 323/312 |
| 2013/0027825 A1* | 1/2013 | Keller | G01R 1/36 361/56 |
| 2015/0311827 A1* | 10/2015 | Villalobos | H02J 7/025 320/108 |
| 2017/0237466 A1* | 8/2017 | Carr | H02J 7/025 455/41.1 |

OTHER PUBLICATIONS

Tim McDonald et al., Evaluation of Power MOSFET Thermal Solutions for Desktop and Mobile Processor Power, International Rectifier, Mar. 2002.
Philip Adamson, Lead-free Packaging for Discrete Power Semiconductors, International Rectifier, May 2002.
Thermal Performance of MOSFET DFN Packages; Analog Power USA Applications Department, Revised Jan. 28, 2016.

* cited by examiner

*Primary Examiner* — Akm Zakaria
(74) *Attorney, Agent, or Firm* — Kusner & Jaffe (57) ABSTRACT

An energy supply for a test device includes an energy source configured to provide energy via an inductive element for use by test circuitry; and an energy recovery circuit electrically couplable to the energy source and configured to direct unused energy from the inductive element to the energy source.

13 Claims, 5 Drawing Sheets

APPARATUS AND METHOD FOR ENERGY RECOVERY

FIELD OF DISCLOSURE

The present disclosure relates generally to recovery of unused energy in testing of a device, and more particularly, to a method and apparatus for directing unused electrical energy remaining in an inductive element to a storage device after a test cycle of testing a semiconductor device.

BACKGROUND

Due to the variations in components, processes or physical phenomena during fabrication, semiconductor devices must undergo certain tests in an early stage of a production process in order to screen out semiconductor devices of sub-par quality.

Inductors can behave as a relatively constant current source, and, therefore, inductors have been used to deliver electrical energy to perform quality testing of semiconductor devices, including, for example, unclamped inductive switching tests. In order to ensure that a sufficient amount of energy is available for inductive testing, inductors are selected in accordance with the power level required for testing. However, since it is possible that not all of the energy stored in an inductor is used during a test interval of a device under test (DUT), the unused energy remaining in the inductor must be dealt with. Conventionally, the unused energy may be dumped via a crowbar circuit or even via the device under test (DUT) after each test interval, which may result in overheating of components of the test circuit or even damaging the DUT itself. Since the inductor is usually emptied after each test interval, the energy storage device must be recharged fully to refill the inductor for a subsequent test interval. Such dumping and refilling of energy occur upon the completion of each interval, resulting in waste of usable energy and waste of time to dump and to refill before beginning the next test interval. Further, since the rate of testing can be very high (e.g., 10 tests per second), the already high power consumption level due to having to fully recharge the energy storage device before each test interval increases even more.

SUMMARY

It would be desirable to reduce the power consumption for testing of semiconductor or other devices.

It would be desirable to improve time efficiency for testing of semiconductor or other devices.

One aspect of this disclosure is to utilize the unused energy, which otherwise would have been wasted following testing of a semiconductor device, in recharging an energy storage device after each test interval, and thus, reduce the power consumption for such testing.

Another aspect relates to an energy supply for a test device, including an energy source configured to provide energy via an inductive element for use by test circuitry; and an energy recovery circuit electrically couplable to the energy source and configured to direct unused energy from the inductive element to the energy source.

According to another aspect, optionally the energy source includes an energy storage device electrically couplable to the inductive element to transfer energy into the inductive element via a first switching element.

According to another aspect, optionally the energy source further includes a diode coupled with respect to the inductive element and the test circuitry providing a return current path from the test circuitry to the inductive element.

According to another aspect, optionally the energy recovery circuit is electrically couplable to the energy storage device via a second switching element, and directs unused energy from the inductive element to the energy storage device to recharge the energy storage device when the second switching element is closed.

According to another aspect, optionally the first switching element is in open condition when the second switching element is closed and the energy recovery circuit directs unused energy from the inductive element to the energy storage device to recharge the energy storage device.

According to another aspect, optionally the inductive element is electrically coupled to the test circuitry via a third switching element which disconnects the test circuitry from being electrically coupled with the inductive element when the energy recovery circuit directs unused energy from the inductive element to the energy storage device.

According to another aspect, optionally the second switching element comprises a power MOSFET device and a diode is electrically connected in series with the MOSFET device to block a reverse current flow in the energy recovery circuit.

According to another aspect, optionally a control configured to open and close the respective switching elements.

According to another aspect, optionally the test circuitry includes a switching element configured to electrically couple the test circuitry to the inductive element to provide energy for testing a device under test.

According to another aspect, optionally the switching elements comprise at least one of a silicon controlled rectifier, a power metal oxide substrate field effect transistor (MOSFET) device, an insulated gate bipolar transistor (IGBT) device, an electro-mechanical relay, or a solid state relay.

According to another aspect, optionally the energy recovery circuit is configured to protect a test circuitry operatively coupled to the inductive element by diverting current from flowing into the test circuitry after a test cycle of a device under test.

According to another aspect, optionally the energy supply is operatively coupled to a control that controls the energy supply and the test circuitry.

According to another aspect, optionally the energy recovery circuit includes a current transformer to measure and transmit to the control electrical current information of the inductive element during energy recovery.

According to another aspect, optionally the energy storage device comprises a capacitor bank.

Another aspect relates to a circuit for recovering energy from testing of a device under test (DUT), including an electrical energy storage device; an inductive element connected to provide electrical energy from the electrical energy storage device to a semiconductor device under test; and an electrical energy recovery circuit coupled to the electrical energy storage device and the inductive element, the electrical energy recovery circuit operable to selectively provide electrical energy stored in the inductive element back to the electrical energy storage device.

Another aspect relates to an electrical test apparatus for a semiconductor device under test (DUT), including an electrical energy supply, an electrical energy reservoir, switching apparatus coupling electrical energy from the reservoir to a testing circuit that tests a DUT, and a return electrical path selectively couplable to the reservoir to couple unused energy from the reservoir to the supply after testing of the DUT.

Another aspect relates to a circuit for recovering energy from testing of a semiconductor device under test (DUT), including an energy storage device for storing electrical energy; a first inductive element having a first terminal and a second terminal, wherein the first terminal is electrically connectable to the energy storage device via a first switching element and the second terminal supplies electrical energy from the inductive element to the DUT; and an energy recovery circuit having an input terminal and an output terminal, the input terminal electrically connected to the second terminal of the first inductive element and the output terminal electrically connected to the energy storage device, the energy recovery circuit operable to selectively provide energy stored in the first inductive element back to the energy storage device.

According to another aspect, optionally a diode is coupled with respect to the inductive element and the test circuitry providing a return current path from the test circuitry to the inductive element.

Another aspect relates to a method for recovering unused energy from an energy supply, which provides energy via an inductive element arranged in the energy supply for testing a device, including directing unused energy from the inductive element to the energy supply.

According to another aspect, optionally directing of the unused energy from the inductive element to the energy supply protects a test circuitry operatively coupled to the energy supply by diverting the unused energy from flowing into the test circuitry after a test cycle of a device under test.

According to another aspect, optionally the method further includes charging an electrical energy storage device arranged in the energy supply with a power supply; discharging energy from the electrical energy storage device to the inductive element; and recharging the electrical energy storage device with the unused energy directed from the inductive element for use in a subsequent test cycle.

According to another aspect, optionally the method further includes controlling the energy supply via a controller.

According to another aspect, optionally the method further includes providing energy from the inductive element to a test circuitry for use in testing a device.

One or more of other aspects of this disclosure include reducing power consumption in electric test equipment, expediting testing of a DUT, avoiding waste of usable energy after a test cycle, protecting the test equipment including the DUT, and providing for effective and efficient testing of the DUT.

These and further features of the present disclosure will be apparent with reference to the following description and attached drawings. In the description and drawings, particular embodiments of the present disclosure have been presented in detail as being indicative of some of the ways in which the principles of the disclosure may be employed, but it is understood that the disclosure is not limited correspondingly in scope. Rather, the disclosure includes all changes, modifications and equivalents coming within the scope of the claims appended hereto.

Features that are described and/or illustrated with respect to one embodiment may be used in the same way or in a similar way in one or more other embodiments and/or in combination with or instead of the features of the other embodiments.

DESCRIPTION

The embodiments of the present disclosure provide for energy recovery from an inductive element of an energy source after a test interval, eliminating the inefficient dumping of unused energy and reducing the amount of power needed to recharge the energy source each test interval in preparation for the next test. Thus, the wasting of usable energy and power consumption are reduced as compared to testing without energy recovery.

Referring, now, to the drawings, wherein like reference numerals refer to like parts in the several figures, and primed reference numerals represent parts that are the same or similar to parts that are designated by the same unprimed reference numerals, and wherein the illustrations are somewhat schematic and not necessarily to scale, but are presented to provide together with the description herein an understanding of various features of this disclosure, embodiments of the disclosure are described.

Figure 1:
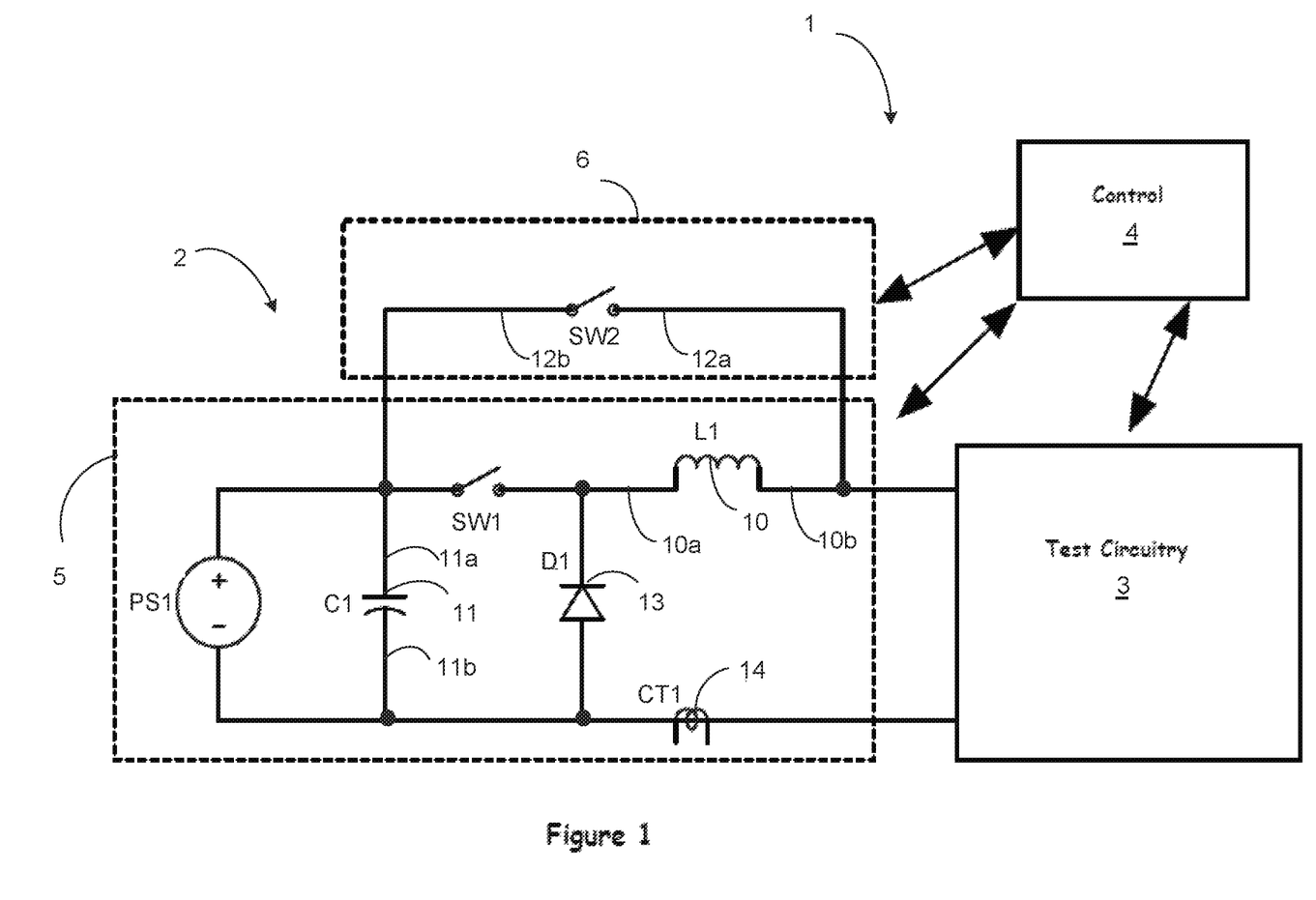
FIG. 1 is a schematic circuit diagram of an embodiment of an exemplary device for testing a semiconductor or other device referred to herein as device under test (DUT) including a circuit for recovering energy in accordance with the present disclosure.

FIG. 1 is a schematic circuit diagram of an embodiment of an exemplary device 1 for testing a device under test (DUT). The device 1 includes an energy supply 2, test circuitry 3, and a control 4. The energy supply 2 supplies power to the test circuitry 3 for testing DUTs (not shown). The energy supply 2 includes an energy source 5 and an energy recovery circuit 6. The energy source 5 includes an inductive element (also sometimes referred to as an inductor) 10 that is charged with energy provided by an energy storage device 11 via a first switching element SW1.

The energy recovery circuit 6 is operable for recovering unused energy remaining in the inductive element 10 after a test cycle of the DUT. Although the DUT is not shown, it would be included in or connected in the test circuitry 3. The energy recovery circuit 6 is electrically couplable to the energy source 5 via a second switching element SW2. The recovered unused energy is directed to the energy storage device 11 in the energy source 5. The energy source 5 is electrically couplable to the test circuitry 3, which is connected to the DUT, to carry out the testing. The test circuitry 3 may be any of various circuits, which currently exist or may come into existence in the future, for testing devices such as, for example, various semiconductor devices.

The control 4 may be, for example, a processor, memory and instructions stored in memory and executable by the processor plus other conventional input/output devices, as will be evident to those skilled in the art. The control 4 is operatively coupled to the energy supply 2 and the test circuitry 3 for controlling the operation of the device 1. For example, the control 4 determines when to perform testing of the DUT, causes activating of the energy recovery circuit 6, and turns on and off the test circuitry 3. The control 4 may be local to the device 1 or may be remote from the device 1, e.g., operating from an external server or elsewhere.

The energy source 5 includes the inductive element 10 (which may be referred to as an electrical energy reservoir), the energy storage device (e.g., a single capacitor or bank of capacitors) 11, and a first switching element SW1. The first switching element SW1 may be a mechanically operated switch, a power metal-oxide-semiconductor field-effect transistor (MOSFET), a silicon-controlled rectifier (SCR), an insulated-gate bipolar transistor (IGBT), or some other switch.

The inductive element 10 has an input terminal 10a and an output terminal 10b. The input terminal 10a of the inductive element 10 is electrically couplable to the energy storage device 11 via the first switching element SW1. The energy storage device 11 discharges energy to the inductive element 10 via the input terminal 10a. Energy from the inductive element 10 is provided to the test circuitry 3 to carry out a test of the DUT. The energy storage device 11 may also be electrically coupled to a power source PS1 for charging the energy storage device 11. For the initial test cycle of the DUT, the energy storage device 11 is charged by the power source alone to perform the testing of the DUT. After completing the initial test cycle, however, the energy storage device 11 is recharged with the recovered unused energy from the inductive element 10 and from the power source PS1.

For recovering unused energy, the first switching element SW1 is in an open condition and a second switching element SW2 (discussed further later) closes. The output terminal 10b of the inductive element 10 is electrically coupled to an incoming end 12a of the second switching element SW2. The outgoing end 12b of the second switching element SW2 is electrically coupled to the high potential end 11a of the energy storage device 11. When the second switching element SW2 is closed, the unused energy remaining in the inductive element 10 is directed from the inductive element 10 to the energy storage device 11 via the closed second switching element SW2.

The high potential end 11a of the energy storage device 11 is also electrically couplable to the input terminal 10a of the inductive element 10 via the first switching element SW1. The first switching element SW1 and the input terminal 10a of the inductive element 10 are also connected to a cathode of a diode D1 13. The diode D1 13 allows the continued flow of current when the first switching element SW1 is opened by going into conduction when the first switching element SW1 breaks the current flow by opening. The anode of the diode D1 13 is electrically coupled to the low potential end 11b of the energy storage device 11. A first current transformer CT1 14 monitors or measures current level in the inductive element 10 during testing of the DUT and provides the current level information for use by the control 4. The first current transformer CT1 14 is also electrically coupled to the test circuitry 3.

When a test cycle of the DUT begins, the first switching element SW1 closes and the test circuitry 3 is turned on by the control 4. Thus, upon closing of the first switching element SW1, a first closed circuit is formed, including the energy storage device 11, the first switching element SW1, the inductive element 10, and the test circuitry 3. The energy storage device 11 discharges electrical energy into the inductive element 10 via the closed first switching element SW1. Current is ramped up in the inductive element 10.

The first current transformer CT1 14 measures the level of the current being ramped up in the inductive element 10 and sends the measurement to the control 4. The control 4, in turn, monitors the current level in the inductive element 10. When the monitored current reaches a predetermined level sufficient to perform the testing of the DUT, the control 4 causes the first switching element SW1 to open.

When the first switching element SW1 opens, the diode D1 13 is biased on and forms a second closed circuit, including the diode D1 13, the inductive element 10, and the test circuitry 3. The diode D1 13 allows the continued flow of current when the first switching element SW1 is opened by going into conduction when the first switching element SW1 breaks the current flow by opening. The current in the inductive element 10 ramps down while the inductive element 10 continues to supply the electrical energy to the test circuitry 3 for completion of the test cycle of the DUT. Also, the first current transformer CT1 14 continues to monitor the current level in the inductive element 10. Upon reaching a second predefined inductive current level, e.g., indicating the completion of the test cycle of the DUT, the control 4 causes the second switching element SW2 to close. The control 4 may cause completion of the test cycle based on another parameter than the inductive current level, e.g., based on time or other parameter. After the second switching element SW2 is closed, the current (i.e., the unused energy after testing of the DUT) remaining in the inductive element 10 continues to ramp down. However, the unused energy is now directed from the inductive element 10 to the energy storage device 11 via the closed second switching element SW2 for recovery and reuse of the unused energy in a next test cycle, e.g., to test the same or a different DUT.

Since some of the electrical energy stored in the inductive element 10 had been used during testing of the DUT, therefore, the energy storage device 11 may not be recharged fully using only the recovered unused energy from the inductive element 10. Hence, the power source PS1, which was a sole power supply for the energy source 5 for the initial test cycle, now becomes an ancillary power source for supplying only the shortage of electrical energy for recharging the energy storage device 11 for a subsequent test cycle.

Further, by directing the unused energy remaining in the inductive element 10 to the energy storage device 11, the device 1 in FIG. 1 also protects and prevents the unused energy from flowing into the test circuitry 3. That is, the present embodiment eliminates conventional dumping of the unused energy remaining in the inductive element 10 after each test cycle of a DUT via the components of the test circuitry 3. Such dumping of the unused energy via the test circuitry might otherwise damage the components of the test circuitry, possibly including the DUT itself. Such damage is avoided in the present embodiment.

Figure 2:
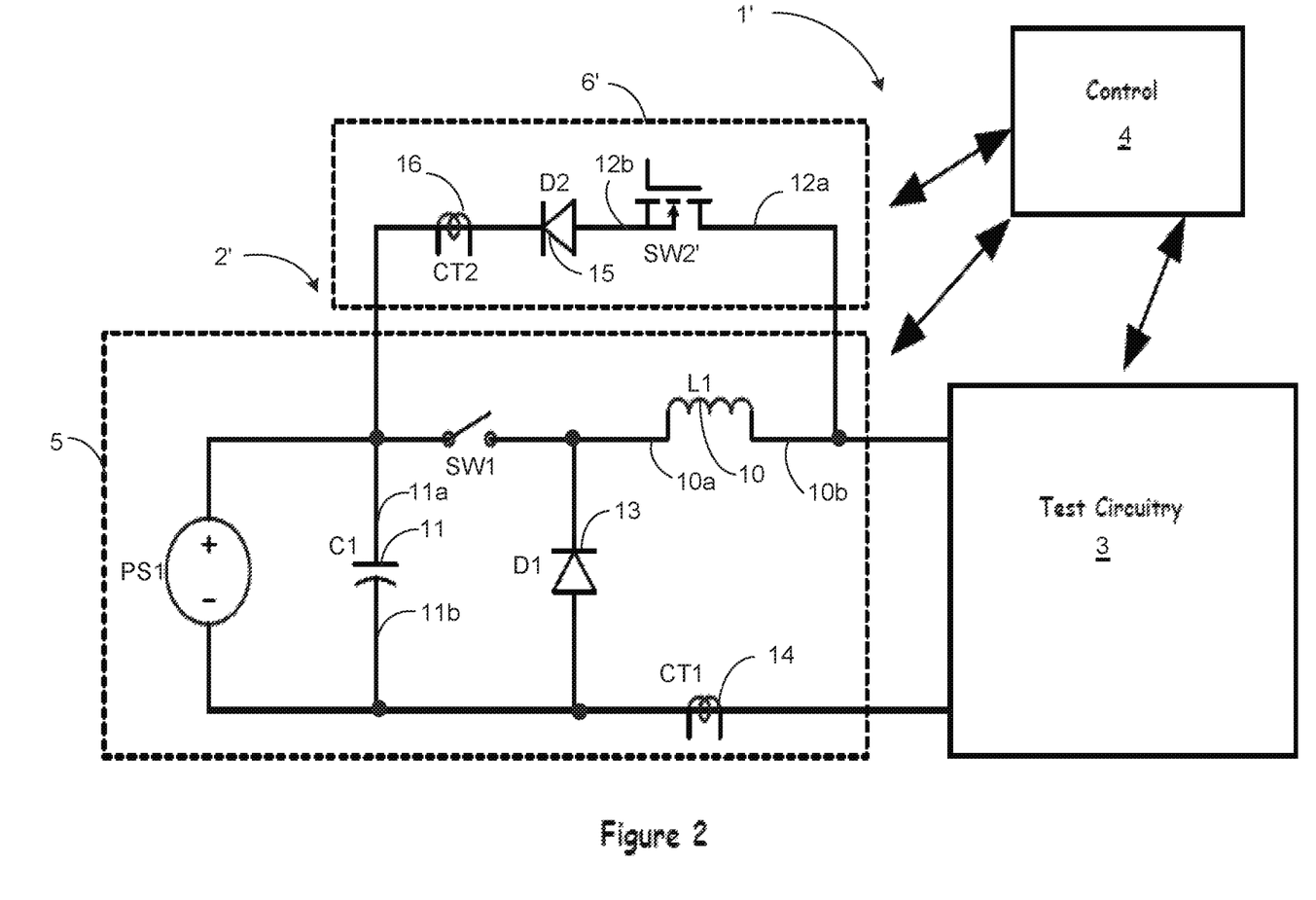
FIG. 2 is a schematic circuit diagram of a second embodiment of an exemplary device for testing a DUT including a circuit for recovering energy in accordance with the present disclosure.

FIG. 2 is a schematic circuit diagram of an embodiment of an exemplary device 1' for testing a DUT including an energy supply 2' and a circuit 6' for recovering energy in accordance with the present disclosure. FIG. 2 is different from FIG. 1 in that the energy recovery circuit 6' includes a MOSFET as the second switching element SW2', a diode D2 15 connected in series with the MOSFET SW2', and an optional second current transformer CT2 16. The second current transformer CT2 16 monitors the current level in the inductive element 10 during the energy recovery.

The drain terminal of the MOSFET SW2' is electrically coupled to the output terminal 10b of the inductive element 10. The source terminal of the MOSFET SW2' is electrically coupled to the anode of the series diode D2 15. The cathode of the series diode D2 15 is electrically coupled to the high potential end 11a of the energy storage device 11. The series diode D2 15 blocks reverse current flow through the MOSFET SW2'. A reverse current flow otherwise might occur because a MOSFET has a body diode whose polarity is inverse to the polarity of the MOSFET. Thus, when a MOSFET is turned off, current can flow in the reverse direction (from the source to the drain). Hence, without the series diode D2 15 the current may flow back into the output terminal 10b of the inductive element 10, tending to defeat the energy recovery. Thus, the series diode D2 15 blocks the reverse current flow when a MOSFET is used as the second switching element SW2'. In other scenarios using, for instance, an SCR as the second switching element SW2', there is no need for the series diode D2 15 since the current flows in one direction only with an SCR.

The control 4 causes to turn on the MOSFET SW2' to turn on upon reaching a second predefined inductive current level indicating the completion of the test cycle of the DUT. The unused energy remaining in the inductive element 10 is, in turn, directed to the drain terminal of the MOSFET SW2'. The unused energy then flows from the drain terminal to the source terminal of the MOSFET SW2'. The unused energy is further directed to the positive potential end 11a of the energy storage device 11 via the series diode D2 15. When the second current transformer CT2 16 detects a third predefined inductive current level (e.g., zero current or some other predefined inductive current level remaining in the inductive element 10) or after a specified time period, the energy recovery is complete. At this point the second switching element SW2' may be opened; and the first switching element SW1 may be closed to do the next test of the same or different DUT.

Figure 3:
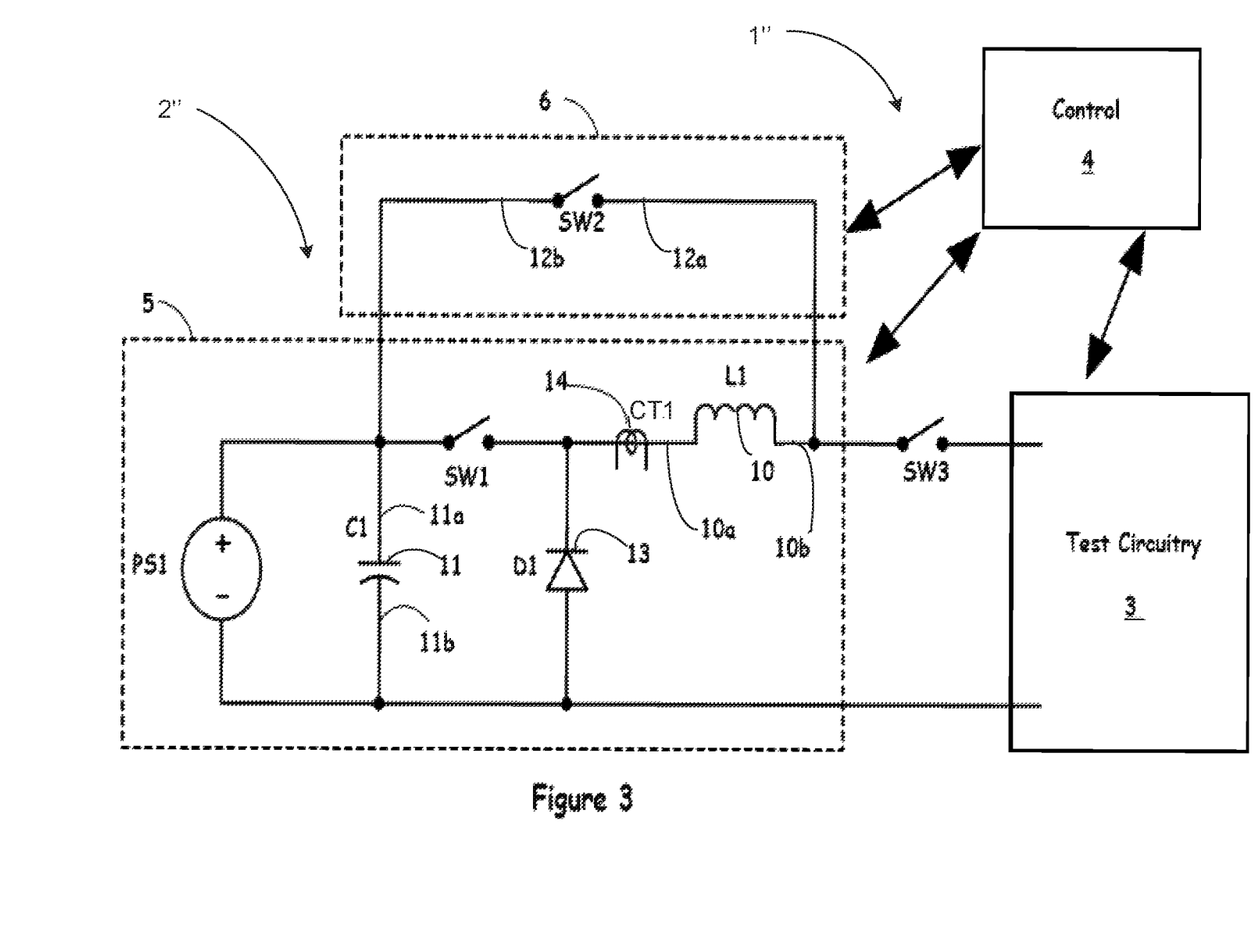
FIG. 3 is a schematic circuit diagram of a third embodiment of an exemplary device for testing a DUT including a circuit for recovering energy in accordance with the present disclosure.

FIG. 3 is a schematic circuit diagram of a third embodiment of an exemplary device 1" for testing a DUT including an energy supply 2" and a circuit 6 for recovering energy in accordance with the present disclosure. Although the DUT is not shown, it would be included in or connected to the test circuitry 3. FIG. 3 is different from FIG. 1 in that FIG. 3 shows a third switching element SW3 (e.g., a MOSFET, SCR, IGBT, etc.) that is operable to connect and to disconnect the test circuitry 3 with respect to the energy supply 2". In addition, as compared to FIG. 1, the first current transformer CT1 14 has been moved to the input 10a of the inductive element 10 so current can be measured during the test cycle or during energy recovery with just one current transformer.

The third switching element SW3 is electrically coupled to the output terminal 10b of the inductive element 10 and the second switching element SW2. The third switching element SW3 closes when the first switching element SW1 closes to perform the testing of a DUT. When the third switching element SW3 is closed, the second closed circuit is formed, including the inductive element 10, the test circuitry 3 and DUT. Via the second closed circuit, current is ramped up in the inductive element 10 and flows to the test circuitry 3 and DUT.

The first switching element SW1 opens as controlled by the control 4, when the current in the inductive element 10 reaches the first predefined level, e.g., as monitored by the first current transformer CT1 14. When the first switching element SW1 opens, the diode D1 13 is biased on and forms a second closed circuit, including the diode D1 13, the inductive element 10, and the test circuitry 3. The diode D1 13 allows the continued flow of current when the first switching element SW1 is opened by going into conduction when the first switching element SW1 breaks the current flow by opening. The current in the inductive element 10 ramps down while the inductive element 10 continues to supply the electrical energy to the test circuitry 3 for completion of the test cycle of the DUT.

Also, the first current transformer CT1 14 continues to monitor the current level in the inductive element 10. Upon reaching a second predefined inductive current level, e.g., indicating the completion of the test cycle of the DUT, the control 4 causes the second switching element SW2 to close. The control 4 may cause completion of the test cycle based on another parameter than the inductive current level, e.g., based on time or other parameter. After the second switching element SW2 is closed, the current (i.e., the unused energy after testing of the DUT) remaining in the inductive element 10 continues to ramp down. However, the unused energy is now directed from the inductive element 10 to the energy storage device 11 via the closed second switching element SW2 for recovery and reuse of the unused energy in a next test cycle, e.g., to test the same or a different DUT.

Note the device 1" of FIG. 3 the energy recovery circuit 6 and the third switching element SW3 prevent current from flowing into the test circuitry 3 after the completion of the test cycle. Thus, by preventing current from flowing into the test circuitry 3, the device 1" protects the test circuitry 3 and the components within the test circuitry 3 from damaging currents and/or voltages. That is, the device 1" eliminates conventional dumping of the unused energy remaining in the inductive element 10 by completely removing the electrical connection between the test circuitry 3 and the inductive element 10. Thus, potential damage to the test circuitry 3 is avoided and the test circuitry 3, including the DUT, is protected by the operation of the energy recovery circuit 6 and the third switching element SW3 in the device 1".

Figure 4:
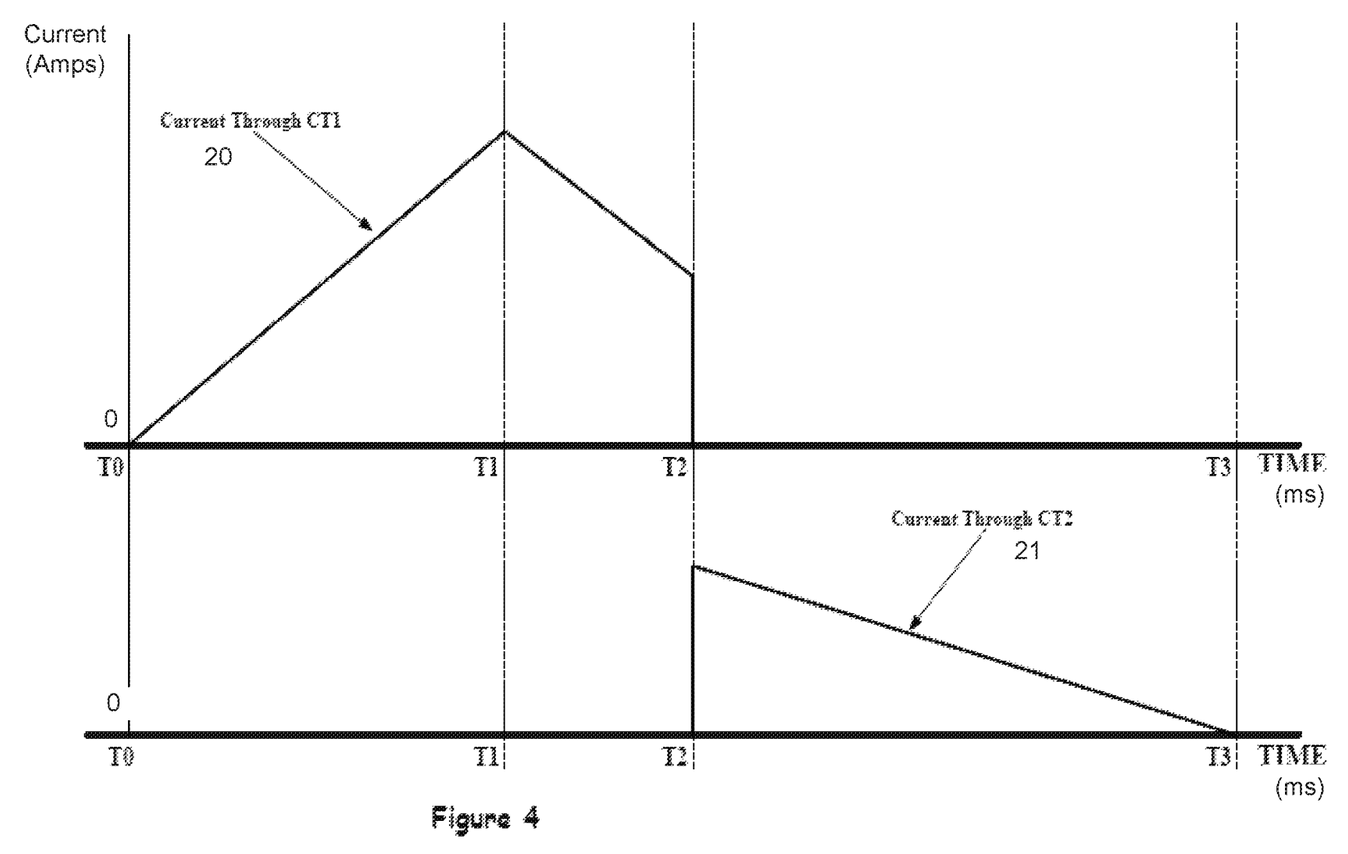
FIG. 4 depicts waveforms of electric current signals occurring during a test cycle of a device under test (DUT) and energy recovery performed by the circuit of FIG. 2 in accordance with the present disclosure.

FIG. 4 depicts waveforms of current signals representative of changes in the current level in the inductive element 10 during a test cycle of a device under test (DUT) and energy recovery performed by the device 1' of FIG. 2 in accordance with the present disclosure. Signal 20 represents changes in current in the inductive element 10 measured by the first current transformer CT1 14 during a test cycle of a DUT. Signal 21 represents changes in current in the inductive element 10 measured by the second current transformer CT2 16 during the energy recovery process after the test cycle.

At time T0, current level in the inductive element 10 is zero. The first switching element SW1 closes immediately after T0; and the test circuitry 3 is biased on, and a test cycle of a DUT begins. Upon closing of the first switching element SW1, a first closed circuit is formed. The first closed circuit includes the energy storage device 11, the first switching element SW1, the inductive element 10, and the test circuitry 3.

During the period starting immediately after T0 and ending at time T1 the energy storage device 11 discharges current into the inductive element 10 via the closed first switching element SW1. Thus, current 20 is ramped up in the inductive element 10 until the current 20 reaches a predefined level sufficient for performing testing of the DUT. The current information in the inductive element 10 is monitored by the first current transformer CT1 14 and is communicated to the control 4. When the current 20 in the inductive element 10 reaches the predefined level at T1, the control 4 causes the first switching element SW1 to open at time immediately following T1.

During the period starting immediately after T1 and ending at time T2, a second closed circuit is formed. The second closed circuit includes the inductive element 10, the test circuitry 3, and the diode D1 13. During that period, the testing of the DUT is performed, indicated by a decline of the current 20 stored in the inductive element 10. The first current transformer CT1 14 continues to monitor the current level in the inductive element 10 and communicates the current information to the control 4. At T2 the current reaches a second predefined level, which indicates the completion of the test cycle of the DUT.

Immediately after T2 the control 4 causes the second switching element SW2' to close. Upon closing of the second switching element SW2', energy recovery begins by providing a return path for the unused energy remaining in the inductive element 10 to recharge the energy storage device 11 with the recovered unused energy. The energy recovery continues until time T3 at which the current 21 has been ramped down in the inductive element 10. The energy recovery occurs as can be seen by the decline of the current 21 monitored by the second current transformer CT2 16 (FIG. 2).

At T3 the energy recovery has been completed. Since some of the electrical energy in the inductive element 10 was used during the test cycle, the recovered unused energy is not sufficient to fully recharge the energy storage device 11 to perform a next test cycle. Thus, the power supply PS1 supplies the shortage amount in the current to the energy storage device 11 in order to fully recharge the energy storage device 11. Upon fully recharging the energy storage device 11, a next test cycle of the DUT may begin.

Figure 5:
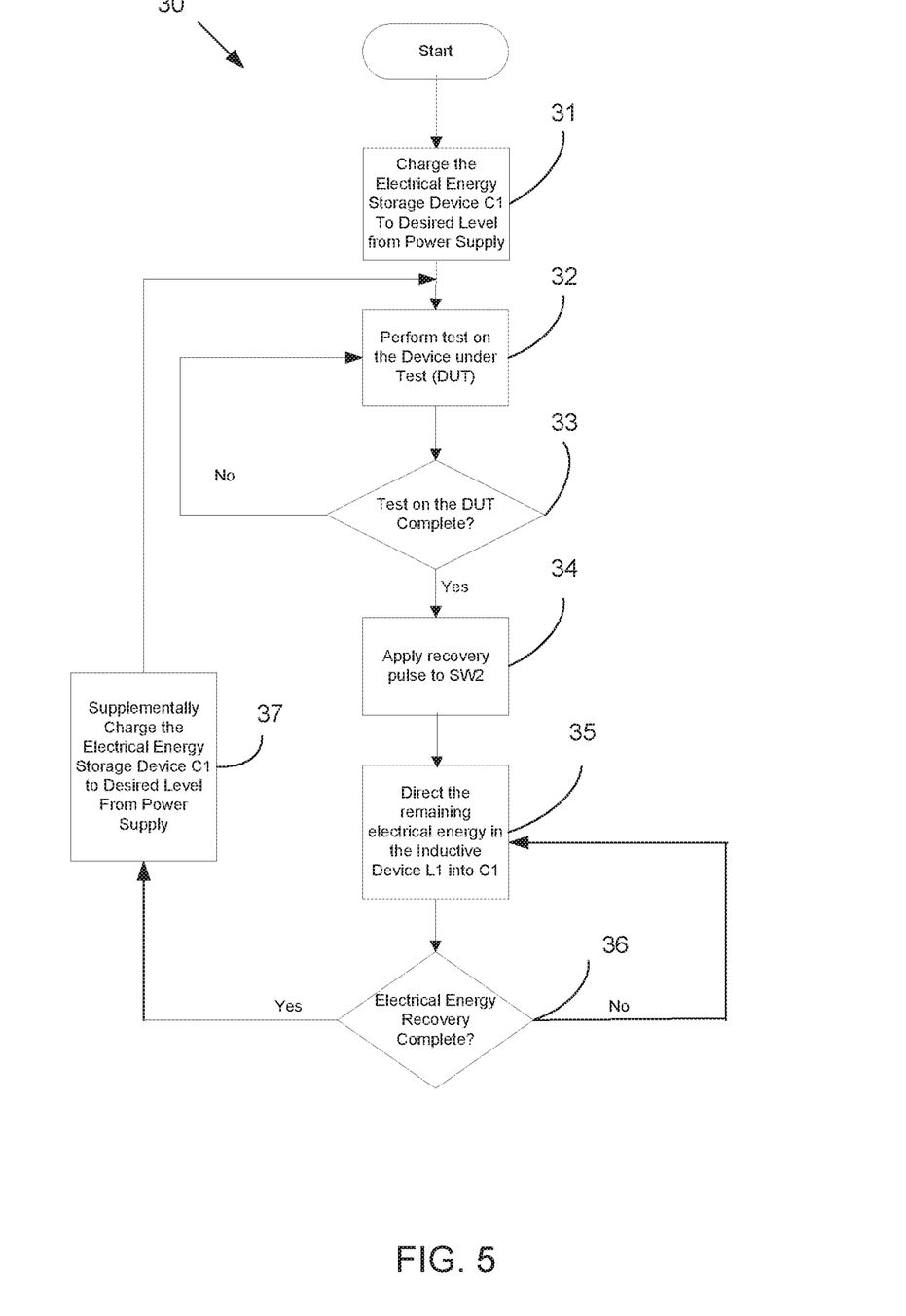
FIG. 5 is a flow chart depicting the steps of an exemplary method recovering the unused electrical energy stored in an inductive element in accordance with the present disclosure.

FIG. 5 is a flow chart depicting a method 30 for recovering unused energy remaining in the inductive element 10 after a test cycle of testing a DUT in accordance with the present disclosure. The method describes steps of a general testing of a DUT utilizing energy recovery, and may vary depending on the types of the tests performed and devices being tested.

The method 30 begins at step 31 in which the energy storage device 11 (FIG. 1) is charged via a power supply PS1 (FIG. 1) to a required or desired voltage amount. With respect to charging/recharging of the energy storage device 11 it is noted that the energy storage device 11 is initially charged by the power source PS1 only. This is because no testing of a DUT has been performed, and thus, no electrical energy has been dispensed for any prior testing. After the device testing begins and the initial test cycle has been completed, the energy storage device 11 is recharged by the power supply PS1 and by the unused energy recovered from the inductive element 10. This is because at the end of each test cycle the inductive element 10 would have used some of the electrical energy for testing a DUT. Thus, the unused energy recovered from the inductive element 10 would not be the same initial amount as the initial charging of the energy storage device 11.

Once the electrical energy is stored in the energy storage device 11, the method 31 moves to step 32. At step 32, a test cycle of a DUT begins. The first switching element SW1 (FIG. 1) closes and the test circuitry 3 (FIG. 1) is biased on. A first closed circuit is formed, including the energy storage device 11, the first switching element SW1, the inductive element 10, and the test circuitry 3. As the current 20 (FIG. 4) ramps up in the inductive element 10, the first current transformer CT1 14 monitors (also sometimes referred to as measures) the level of the current 20 in the inductive element 10 and communicates the measurement(s) to the control 4 (FIG. 1). When the current 20 reaches a predefined level sufficient for performing testing of a DUT in the test circuitry 3 (FIG. 1), the control 4 causes the first switching element SW1 to open. Upon opening of the first switching element SW1, a second closed circuit is formed. The second closed circuit includes the inductive element 10, the test circuitry 3, and a diode D1 13. The inductive element 10 supplies a predefined amount of the energy to the test circuitry 3 and performs the testing of the DUT. During this time period, the first current transformer CT1 14 continues to measure the current 20 and communicates the measurement(s) to the control 4. As the measurement continues, the method 30 moves to step 33.

At step 33, based on the measurement(s) communicated from the first current controller CT1 14, the control 4 determines whether the testing on the DUT is complete. The testing on the DUT may be complete if the measured current level in the inductive element reaches a second predefined level which indicates the completion of the testing of the DUT. If, at step 33, it is determined that the testing on the DUT is not complete, the method reverts to step 32. If, however, when the control 4 determines that the testing of the DUT is complete, the method moves to step 34. At step 34, the control 4 causes the second switching element SW2 (FIG. 1) to close, e.g., by applying a recovery signal to the second switching element SW2 (FIGS. 1 and 3) or to SW2' (FIG. 2). Then, the method moves to step 35. At step 35, the energy recovery circuit 6 (FIG. 1) recovers the unused energy remaining in the inductive element 10 and directs the recovered unused energy into the energy storage device 11.

Then, the method moves to step 36 at which it is determined whether the energy recovery is complete or not. For determining whether the energy recovery is complete, an optional second current transformer CT2 16 (FIG. 2) may be included in the energy recovery circuit 6' (FIG. 2). The energy recovery may be complete if the measured current level in the inductive element 10 is zero. If, at step 36, it is determined that the energy recovery is not complete, the method reverts to step 35. If it is determined that the energy recovery is indeed complete, then the method moves to step 37 and the second switching element SW2 is opened. At step 37, the energy storage device 11 is supplementally recharged to a predefined or desired level for a subsequent test cycle (e.g., testing of the same or different DUT) from the power supply PS1.

Although the disclosure has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the disclosure. In addition, while a particular feature of the disclosure may have been described above with respect to only one or more of several illustrated embodiments, such feature may be combined with one or more other features of the other embodiments, as may be desired and advantageous for any given or particular application.

What is claimed is:

1. An energy supply for a test device, comprising:
   an energy source including an energy storage device and
      an inductive element, the energy source configured to provide energy stored in the energy storage device to the inductive element for use by test circuitry;

a first switching element operative to selectively couple a first terminal of the energy storage device to a first terminal of the inductive element to transfer energy to the inductive element; and an energy recovery circuit electrically couplable to the energy source and configured to direct unused energy from the inductive element to the energy source, the energy recovery circuit including a second switching element different from the first switching element, the second switching element operative to selectively couple a second terminal of the inductive element to the first terminal of the energy storage device.

2. The energy supply of claim 1, further comprising a first diode coupled with respect to the inductive element and the test circuitry, the diode providing a return current path from the test circuitry to the inductive element.

3. The energy supply of claim 1, wherein the energy recovery circuit directs unused energy from the inductive element to the energy storage device to recharge the energy storage device when the second switching element is closed.

4. The energy supply of claim 2, wherein the first switching element is in open condition when the second switching element is closed and the energy recovery circuit directs unused energy from the inductive element to the energy storage device to recharge the energy storage device.

5. The energy supply of claim 2, further comprising a third switching element, wherein the inductive element is electrically couplable to the test circuitry via the third switching element to selectively connect/disconnect the test circuitry to the inductive element when the energy recovery circuit directs unused energy from the inductive element to the energy storage device.

6. The energy supply of claim 2, wherein the second switching element comprises a power MOSFET device and a second diode is electrically connected in series with the power MOSFET device to block a reverse current flow in the energy recovery circuit.

7. The energy supply of claim 3, and further comprising a controller configured to open and close the respective switching elements.

8. The energy supply of claim 3, wherein the test circuitry includes a third switching element configured to electrically couple the test circuitry to the inductive element to provide energy for testing a device under test.

9. The energy supply of claim 4, wherein the first and second switching elements comprise at least one of a silicon controlled rectifier, a power metal oxide substrate field effect transistor (MOSFET) device, an insulated gate bipolar transistor (IGBT) device, an electro-mechanical relay, or a solid state relay.

10. The energy supply of claim 1, wherein the energy recovery circuit is configured to protect the test circuitry operatively coupled to the inductive element by diverting current from flowing into the test circuitry after a test cycle of a device under test.

11. The energy supply of claim 1, wherein the energy supply is operatively coupled to a controller that controls the energy supply and the test circuitry.

12. The energy supply of claim 11, wherein the energy recovery circuit includes a current transformer to measure and transmit to the controller electrical current information of the inductive element during energy recovery.

13. The energy supply of claim 1, wherein the energy storage device comprises a capacitor bank.

* * * * *